(12) United States Patent
Zhang et al.

(10) Patent No.: US 11,923,857 B1
(45) Date of Patent: Mar. 5, 2024

(54) DTC NONLINEARITY CORRECTION

(71) Applicant: XILINX, INC., San Jose, CA (US)

(72) Inventors: Hongtao Zhang, San Jose, CA (US); Ankur Jain, Sunnyvale, CA (US); Yanfei Chen, Cupertino, CA (US); Ronan Sean Casey, Cork (IE); Winson Lin, San Francisco, CA (US); Hsung Jai Im, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/102,066

(22) Filed: Jan. 26, 2023

(51) Int. Cl.
*H03L 7/08* (2006.01)
*H03L 7/099* (2006.01)
*H03M 1/82* (2006.01)

(52) U.S. Cl.
CPC .......... *H03L 7/0802* (2013.01); *H03L 7/0991* (2013.01); *H03M 1/82* (2013.01)

(58) Field of Classification Search
CPC ....... H03L 7/0802; H03L 7/0991; H03M 1/82
See application file for complete search history.

(56) References Cited

U.S. PATENT DOCUMENTS

| | | | |
|---|---|---|---|
| 9,520,890 B1 * | 12/2016 | Ben-Bassat | H03M 1/1014 |
| 10,211,842 B2 * | 2/2019 | Zhao | H03L 7/091 |
| 10,459,407 B1 * | 10/2019 | Degani | H03M 1/1009 |
| 10,505,554 B2 * | 12/2019 | Janardhanan | H03L 7/091 |
| 10,895,850 B1 * | 1/2021 | Elkholy | G04F 10/005 |
| 10,965,297 B1 * | 3/2021 | Wu | H03L 7/0805 |
| 11,283,459 B1 * | 3/2022 | Monk | G04F 5/04 |
| 11,387,833 B1 * | 7/2022 | Li | H03L 7/0891 |
| 11,632,116 B2 * | 4/2023 | Perrott | H03L 7/1976 327/156 |
| 11,632,230 B2 * | 4/2023 | Li | H03L 7/081 327/147 |
| 11,658,667 B2 * | 5/2023 | J | H03L 7/1976 331/23 |
| 2017/0205772 A1 * | 7/2017 | Burg | H03L 7/18 |
| 2017/0366376 A1 * | 12/2017 | Wang | H04L 27/2017 |

(Continued)

FOREIGN PATENT DOCUMENTS

| | | | | |
|---|---|---|---|---|
| EP | 3267578 A1 * | 1/2018 | | H03C 3/0941 |
| EP | 3648352 A1 * | 5/2020 | | H03B 5/1265 |

(Continued)

OTHER PUBLICATIONS

Zhuang, J., et al. "All-Digital RF Phase-Locked Loops Exploiting Phase Prediction," IPSJ Transactions on System LSI Design Methodology, vol. 7 2-15 (Feb. 2014).

*Primary Examiner* — Adam D Houston
(74) *Attorney, Agent, or Firm* — Patterson + Sheridan, LLP

(57) ABSTRACT

Embodiments herein describe correcting nonlinearity in a Digital-to-Time Converter (DTC) by relaxing a DTC linearity requirement, which results in the correction being co-adapted with a DTC gain calibration loop which can operate in parallel with a DTC integral nonlinearity (INL) correction loop. In one embodiment, the DTC gain calibration loop and the DTC INL correction loop are constrained when determining a nonlinearity correction code to improve the likelihood they converge. Once determined, the nonlinearity correction code can be combined with an digital code output by a time-to-digital converter (TDC) to generate a phase difference between a reference clock and a feedback clock.

20 Claims, 10 Drawing Sheets

(56) References Cited

U.S. PATENT DOCUMENTS

2019/0214976 A1* 7/2019 Wu .................... H03L 7/0805
2021/0376841 A1* 12/2021 Okada .................... G06F 1/06

FOREIGN PATENT DOCUMENTS

KR          20220006444 A  *  1/2022
WO     WO-2019125300 A1  *  6/2019  ............. H03L 7/085
WO     WO-2021133415 A1  *  7/2021  ............... G06F 1/08

* cited by examiner

DTC NONLINEARITY CORRECTION

TECHNICAL FIELD

Examples of the present disclosure generally relate to correcting for nonlinearity in a Digital-to-Time Converter (DTC) using constrained DTC gain and nonlinearity correction loops.

BACKGROUND

ADPLL (All Digital PLL) is gaining popularity due to its smaller footprint and good scalability. The basic components include a Time-to-Digital Converter (TDC), a digital loop filter (DLF), and a digital controlled oscillator (DCO). The TDC converts the time difference between an edge of a reference dock (clkref) and an edge of a feedback clock (clkv) into a digital signal or digital code. The DLF is a tow pass filter which filters the digital code and forwards it to the DCO which outputs the feedback dock clkv.

The resolution of the TDC determines the amount of quantization noise added in the system during time-to-digital conversion. Finer resolution in picoseconds is needed for low jitter PLL design. On the other hand, when the frequency of the clock output by the DCO (i.e., clkv) is not an integer multiple of the reference clock frequency, the TDC needs to cover a time range up to at least a full cycle of the reference dock, which is in the order of nanoseconds. When the output clock of the DCO is not an integer multiple of the reference dock, this is referred to as a Fractional N (FracN) PLL. Moreover, a finer resolution limits the range TDC can resolve to a practical number of digital bits (typically 7~8). Thus, it is difficult for the TDC to have fine resolution but also have enough range to cover multiple cycles of the feedback clock clkv in the case of a FracN PLL. This complicates the design of the TDC as well as consumes substantially more power.

SUMMARY

Techniques for a digital phase locked loop (DPLL) are described. One example is a DPLL that includes a digital-to-time converter (DTC) configured to receive a reference dock and delay the reference clock based on a received first digital code, a time-to-digital converter (TDC) configured to output a second digital code indicating a time difference between the delayed reference clock output by the DTC and a clock generated by a digital controlled oscillator (DCO), circuitry it a constrained DTC gain calibration loop and a DTC integral nonlinearity (INL) correction loop configured to generate a nonlinearity correction code, a combination circuit configured to combine the second digital code with the nonlinearity correction code, and a digital loop filter configured to receive an output of the combination circuit.

Another embodiment described herein is an integrated circuit that includes a DTC configured to receive a reference dock and delay the reference dock based on a received first digital code, a TDC configured to output a second digital code indicating a time difference between the delayed reference clock output by the DTC and a clock generated by a DC, a constrained DTC gain calibration loop and a constrained DTC INL correction loop configured to generate a nonlinearity correction code, circuitry configured to generate a phase difference between the reference dock and the dock output of the DCO based on the second digital code and the nonlinearity correction code, and a digital loop filter configured to receive the phase difference.

Another embodiment described herein is a method of operating a DPLL. The method includes delaying a reference clock using a DTC and based on a received first digital code, determining, using a TDC, a time difference between the delayed reference dock and a clock based on an output of a DCO, generating, based on the time difference determined by the TDC and the nonlinearity correction code, a phase difference between the reference clock and the clock output by the DCO, and filtering the phase difference using a DLF.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
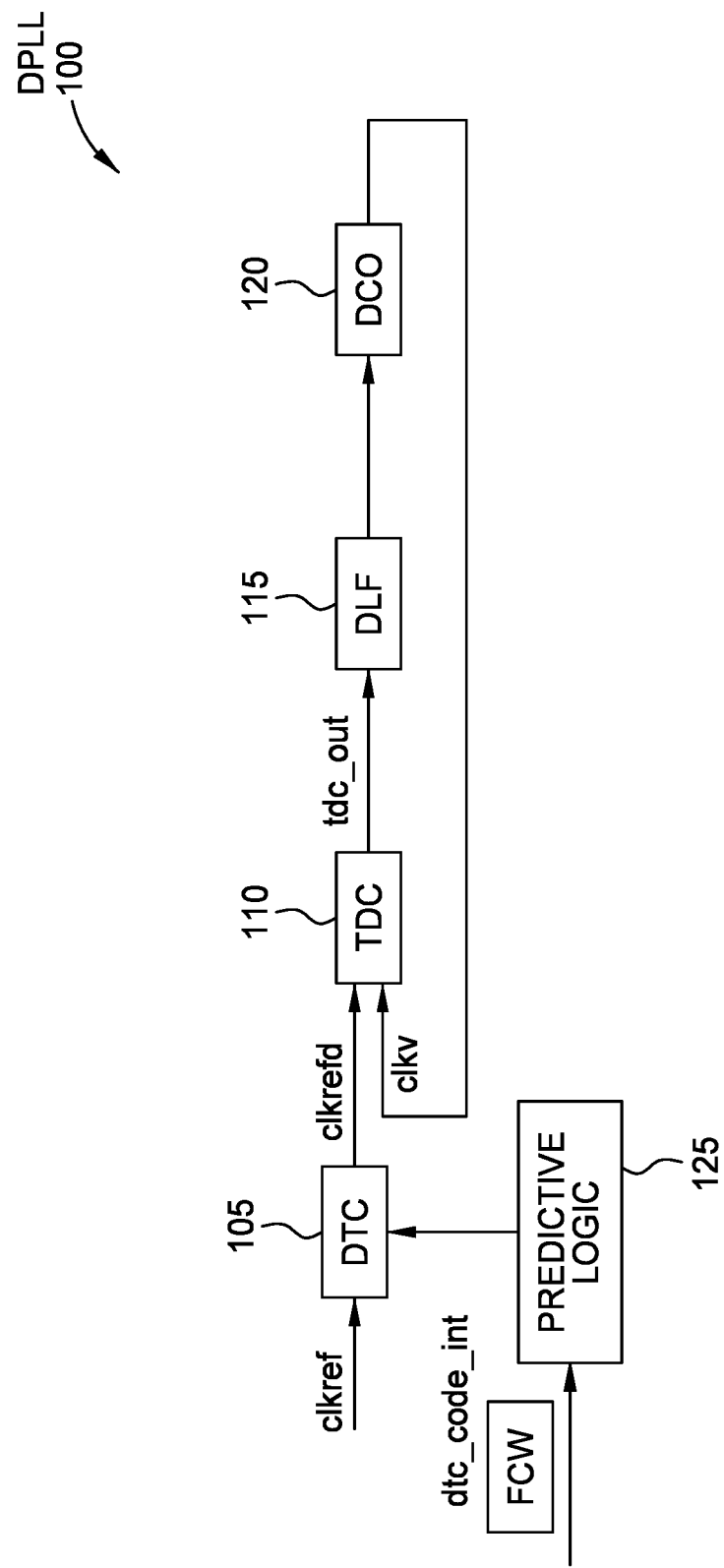
FIG. 1 is a block diagram of a DPLL, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe correcting nonlinearity in a Digital-to-Time Converter (DTC) by relaxing a DTC linearity requirement, which results in a DTC nonlinearity correction loop being co-adapted with a DTC gain calibration loop. As discussed above, fracN PLL designs (e.g., where the reference clock and the clock generated by the DPLL are not integer multiples) add significant constraints on the design of the TDC. The embodiments herein describe using a DTC to help reduce the time range a TDC has to cover by predictively delaying the edge of a reference clock close to the edge of the feedback clock so that the TDC has to cover a much reduced range (e.g., on the order of a few DTC step sizes). This reduced range requirement makes it feasible to achieve a finer resolution of TDC design and hence a low jitter PLL. This design is discussed in FIG. 1.

Figure 2:
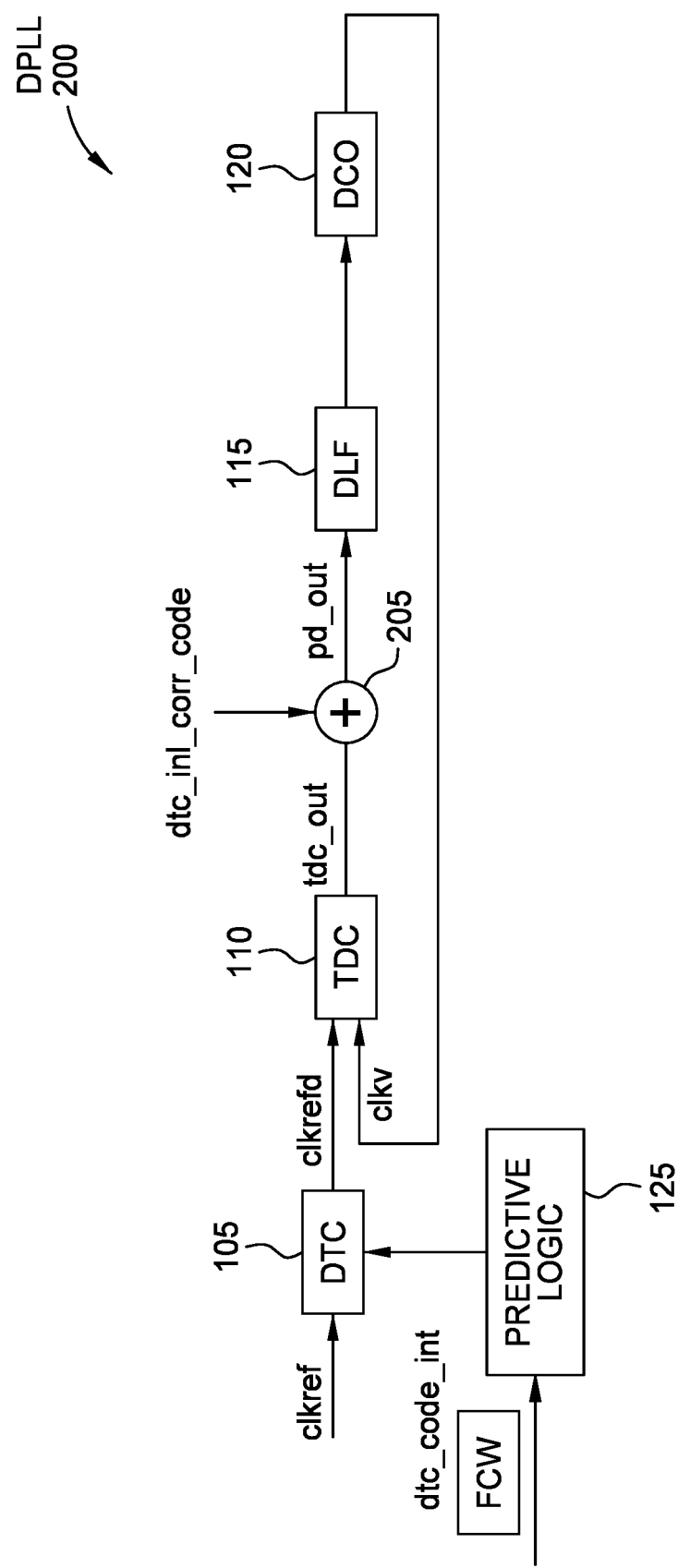
FIG. 2 is a block diagram of a DPLL with nonlinearity correction, according to an example.

This algorithm works well when the DTC step size is uniform, i.e., the DTC is linear. However, the exact DTC step size is usually unknown—i.e., the DTC is nonlinear. The DTC nonlinearity is difficult to minimize in circuit design. Integral nonlinearity (INL) is usually used as a linearity figure of merit to indicate how linear the circuit is. This disclosure proposes techniques to calibrate the nonlinearity of the DTC, and therefore cancel it out as shown in FIG. 2. This relaxes the linearity requirement of the DTC circuit design. The techniques also allow the DTC gain calibration loop and the DTC nonlinearity correction loop to run simultaneously by constraining their search spaces.

FIG. 1 is a block diagram of a DPLL 100, according to an example. The DPLL 100 includes a TDC 110, a DLF 115, and a DCO 120. In a basic DPLL, the TDC 110 determines a time difference (which can also be referred to as a phase difference) between a reference clock and the clock output by the DCO 120 (referred to as the feedback clock (clkv)). However, as discussed above, it is difficult for the TDC 110 to have fine resolution but also have enough range to cover multiple cycles of the feedback clock clkv in the case of a FracN PLL. As such, the DPLL 100 includes a DTC 105 which delays an edge of the reference dock (clkref) to output a delayed reference clock (clkrefd) to the TDC 110.

The DTC 105 reduces the time range a TDC 110 has to cover by predictively delaying the edge of a reference clock close to the edge of the feedback clock such that the TDC 110 only has to cover a reduced range (e.g., on the order of a few DTC step sizes). This reduced range makes it feasible to achieve a finer resolution of the TDC 110 and hence a low jitter DPLL 100.

In one embodiment, the DTC 105 periodically delays the clkref based on a predictive control logic 125 that uses a Frequency Control Word (FCW), which is the frequency ratio between clkv and clkref. That is, the DTC 105 receives a digital code (dtc_code_int) which it then uses to delay the clkref. The delayed reference clock (clkrefd) generated by the DTC 105 is closely phase aligned with clkv within a few DTC steps, thereby reducing the range that has to be covered by the TDC 110.

As shown, the predictive control logic 125 generates a DTC control code (i.e., dtc_code_int) that determines the amount of delay steps used by the DTC 105 to delay clkref. In one embodiment, dtc_code_int is calculated from the expected or predicted delay and the DTC step size. If the step size is known, the code is the ratio of the predicted delay over the step size. However, the exact DTC step size is usually unknown. Thus, in practice, the DTC control code can be determined by multiplying the expected delay with a scaling factor of the DTC (Kdtc), which is adapted from an algorithm that minimizes the averaged mean error.

FIG. 2 is a block diagram of a DPLL with nonlinearity correction, according to an example. FIG. 2 has the same components as FIG. 1, but also includes an adder 205 which adds a nonlinearity correction code (dtc_inl_corr_code) to the output of the TDC 110, tdc_out. The result of adding tdc_out with the dtc_inl_corr_code is pd_out, which is the phase difference that has been normalized to the output of the TDC 110. The remaining figures illustrate various ways the nonlinearity correction code (dtc_inl_corr_code) can be determined.

Figure 3:
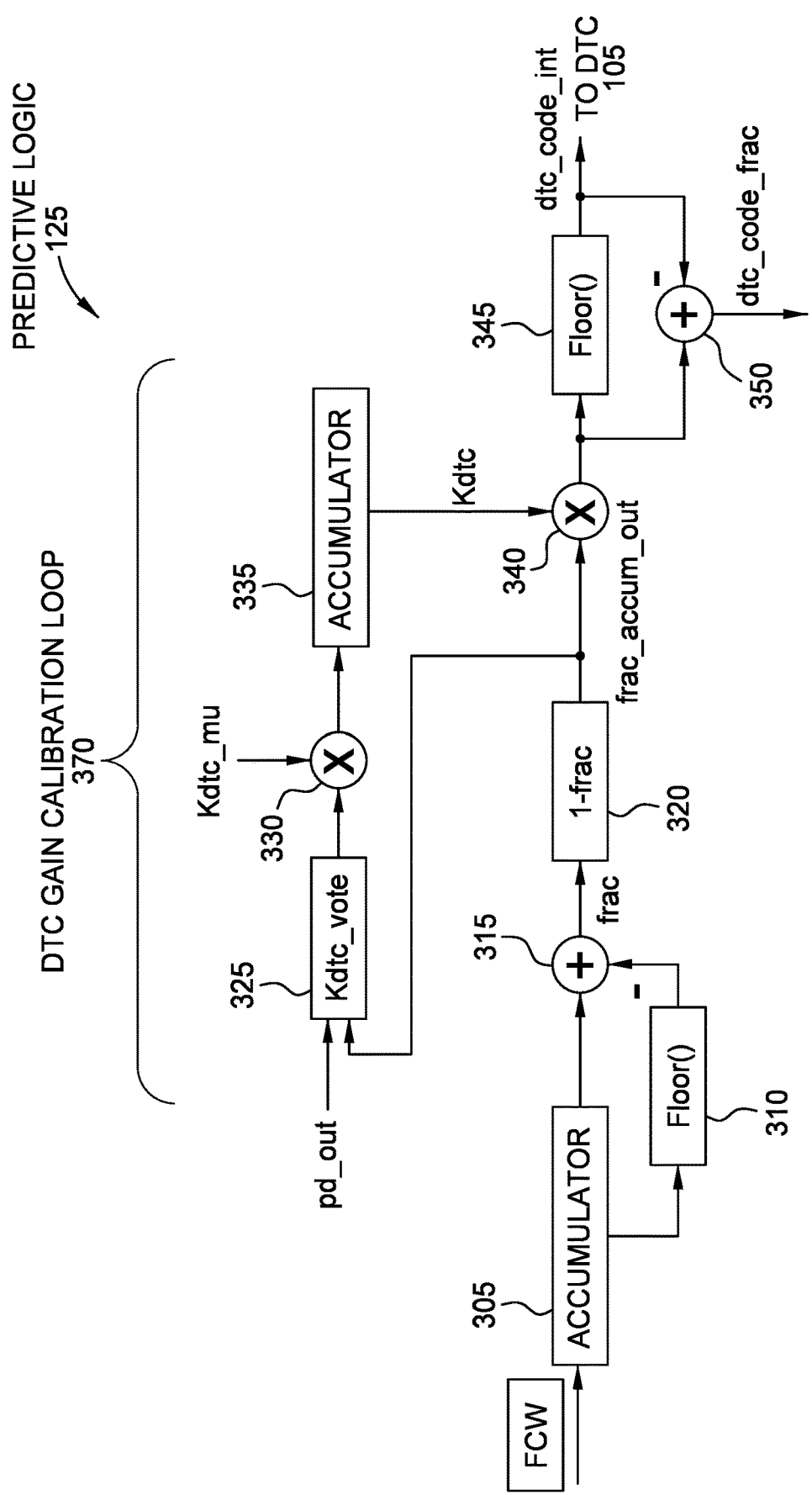
FIG. 3 illustrates one implementation of a DTC gain calibration loop, according to an example.

FIG. 3 illustrates one implementation of predictive logic 125 which includes a DTC gain calibration loop 370, according to an example. An accumulator 305 receives the FCW, which is based on the ratio between clkref and clkv. FCW is fed to the accumulator 305 to generate a measure of reference phase that the DCO needs to match. One output of the accumulator 305 is provided to a floor circuit 310 which truncates the fractional bits and determines the integer portion of the number. The subtractor 315 receives the output of the accumulator 305 and the integer bits from the floor circuit 310. In a hardware implementation, the output of the accumulator 305 is represented as N×m. The floor circuit 310 takes the N MSB (Most Significant Bits, integer portion). The subtraction of N from N·m is equivalent to taking the m LSB (Least Significant Bit, fractional portion). The result of the subtractor 315 is a fractional signal (frac) which is fed into a 1-frac circuit 320 which generates an accumulated fractional output (frac_accum_out). That is, the circuit 320 subtracts the frac signal generated the subtractor 315 from 1. However, other implementations may not include the 1-frac circuit 320.

The signal frac_accum_out is multiplied by the gain of the DTC (i.e., kdtc), which is calculated using the frac_accum_out and the pd_out (i.e., a phase difference between the clkref and clkv), FIG. 3 illustrates a DTC gain calibration loop 370 including a ktdc_vote module 325 (e.g., a voting module implemented using circuitry), a multiplier 330 and an accumulator 335 to generate kdtc. In general, the DTC gain calibration loop 370 uses the pd_out and frac_accum_out to minimize the averaged error between the predicted phase arrival time and the actual phase arrival time.

In one embodiment, the kdtc_vote module 325 performs an vote algorithm defined by the following;
If(frac_accum_out >0.5 && frac_accum_out <1)
    if pd_out >0
        kdtc_vote=1;
    else
        kdtc_vote=−1;
    end
elseif (frac_accum_out <0.5 && frac_accum_out >0)
    if pd_out >0
        kdtc_vote=−1;
    else
        kdtc_vote=1;
    end
else
    kdtc_vote=0;
end
Alternatively, Kdtc_vote can be derived from frac instead of frac_accum_out (which is 1−frac):
if (frac <0.5 && frac >0)
    if pd_out >0
        kdtc_vote=1;
    else
        kdtc_vote=−1;
    end

```
elseif (frac >0.5 && frac <1)
   if pd_out >0
      kdtc_vote=-1;
   else
      kdtc_vote=1;
   end
else
   kdtc_vote=0;
end
```

The result of the kdtc_vote module 325 is multiplied with an adaption parameter kdtc_mu by a multiplier 330. In one embodiment, the kdtc_mu is a step size. The kdtc_mu may be a constant, but is can also be dynamically adjusted. For example, to enable faster convergence, the kdtc_vote may initially be set to a larger step size, but then could be reduced to make the output of the loop 370 more accurate. The result of multiplying the kdtc_mu to the voting results is then accumulated by an accumulator 335 to generate the gain of the DTC—i.e., kdtc.

Kdtc and frac_accum_out are then multiplied by a multiplier 340 where the output is sent to both a floor circuit 345 and a subtractor 350. The signal frac_accum_out is multiplied by the gain of the DTC (i.e., kdtc), and this result, is fed to the floor circuit 345, which performs quantization. That is, the product of kdtc and frac_accum_out determines the delay the DTC 105 should apply. This delay is quantized—i.e., is not continuous in an implementation where the signals are all digitized in a digital PLL. The floor circuit 345 determines the integer portion of the calculated product. The output of the floor circuit 345 is the dtc_code_int for controlling the DTC 105. In addition, the input and output of the floor circuit 345 is subtracted by a subtractor 350 to generate a fractional portion of the digital code (i.e., dtc_code_frac) that is used to correct for the quantization error that occurs due to the generation of DTC code. That is, in one embodiment, the DTC 105 is controlled by an integer digital code—i.e., dtc_code_int—but this ignores that there also can exist a fraction portion dtc_code_frac which represents the quantization error of converting the FCW into an integer digital code dtc_code_int. The fractional portion dtc_code_frac will be discussed in FIGS. 8 and 9 below.

Figure 4:
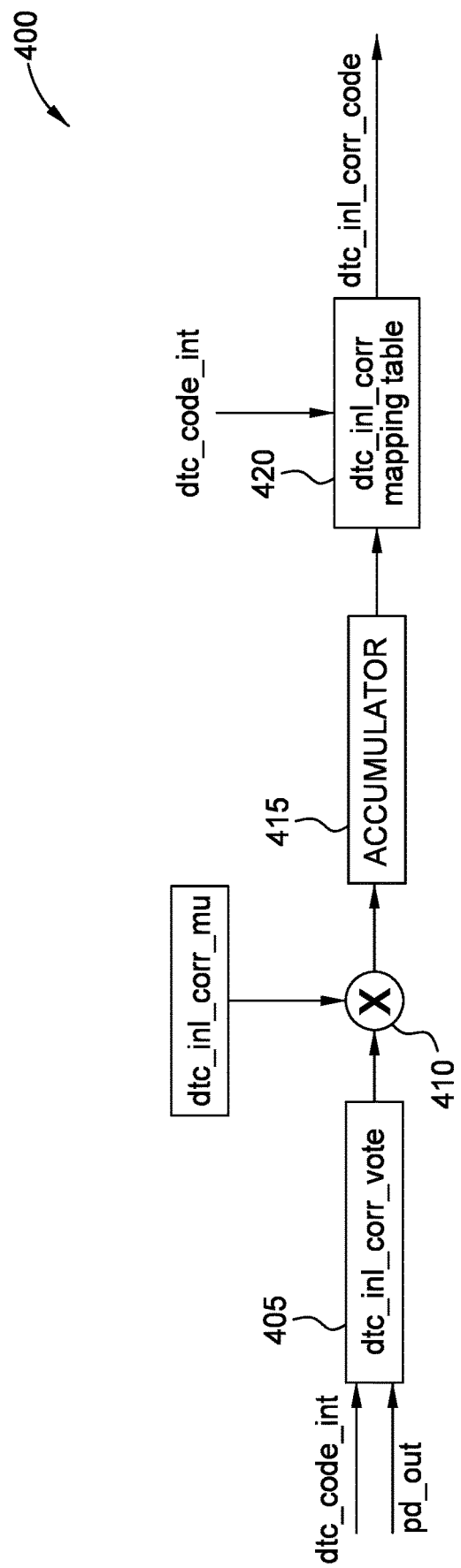
FIG. 4 illustrates one implementation of a DTC integral nonlinearity correction loop, according to an example.

FIG. 4 illustrates a DTC INL correction loop 400, according to an example. The loop 400 includes a dtc_inl_corr_vote module 405 (e.g., a voting module implemented using circuitry) that receives the dtc_code_int from the predictive logic 125 illustrated in FIG. 3, as well as the pd_out discussed in FIGS. 1 and 2 as part of a feedback path.

Figure 5:
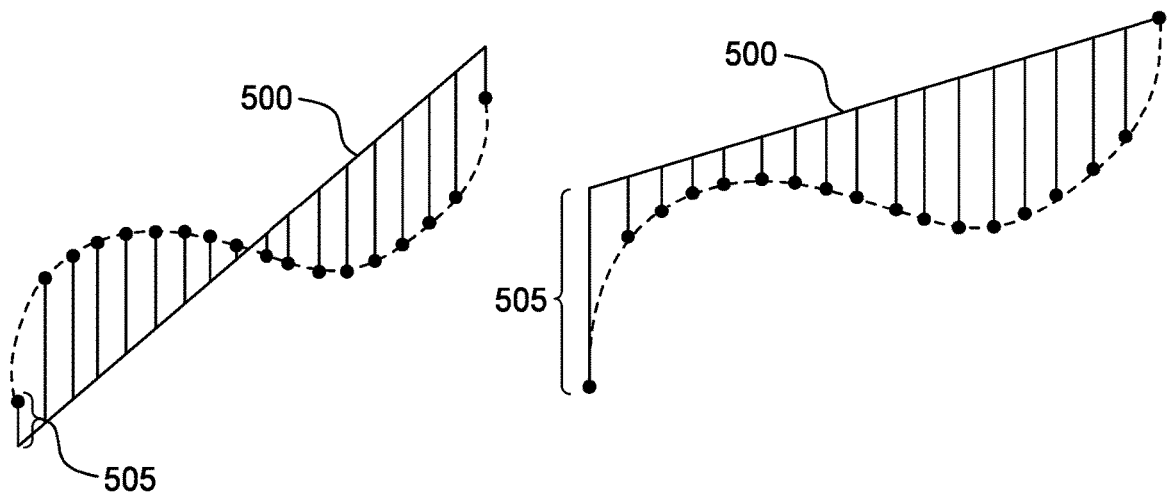
FIG. 5 illustrates results of using unconstrained DTC gain calibration and DTC integral nonlinearity correction loops, according to an example.

The DTC gain calibration loop 370 in FIG. 3 and the DTC INL correction loop 400 in FIG. 4 interact. Both are important to minimize the phase or time error between pd_out and a given DTC code. FIG. 5 illustrates that when Kdtc and DTC INL correction techniques are free to choose (e.g., are unconstrained or not limited to a particular search space), the solution space is unlimited. That is, FIG. 5 illustrates that without constraining the DTC gain calibration loop and the DTC INL correction loop, the Kdtc (i.e., the slope of the line 500) and the DTC INL correction value (e.g., the vertical offset 505 between the points and the line 500) have full freedom to change. As a result, the DTC gain calibration loop and the DTC INL correction loop may not converge.

Figure 6:
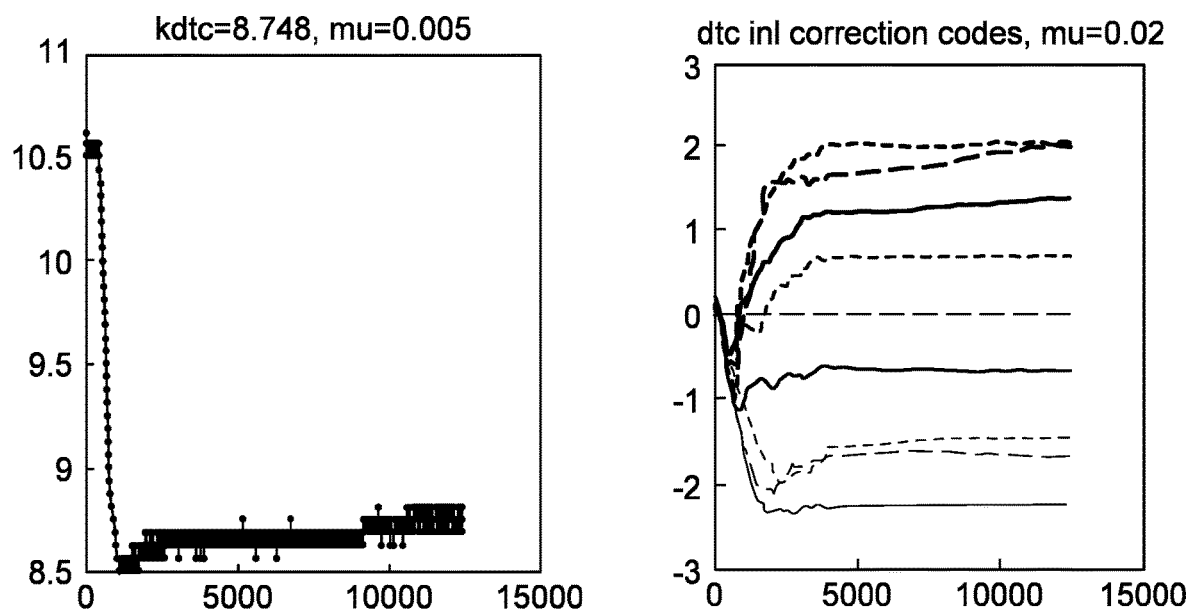
FIG. 6 illustrates Kdtc and DTC INL correction adaptation without constraints, according to an example.
Figure 7:
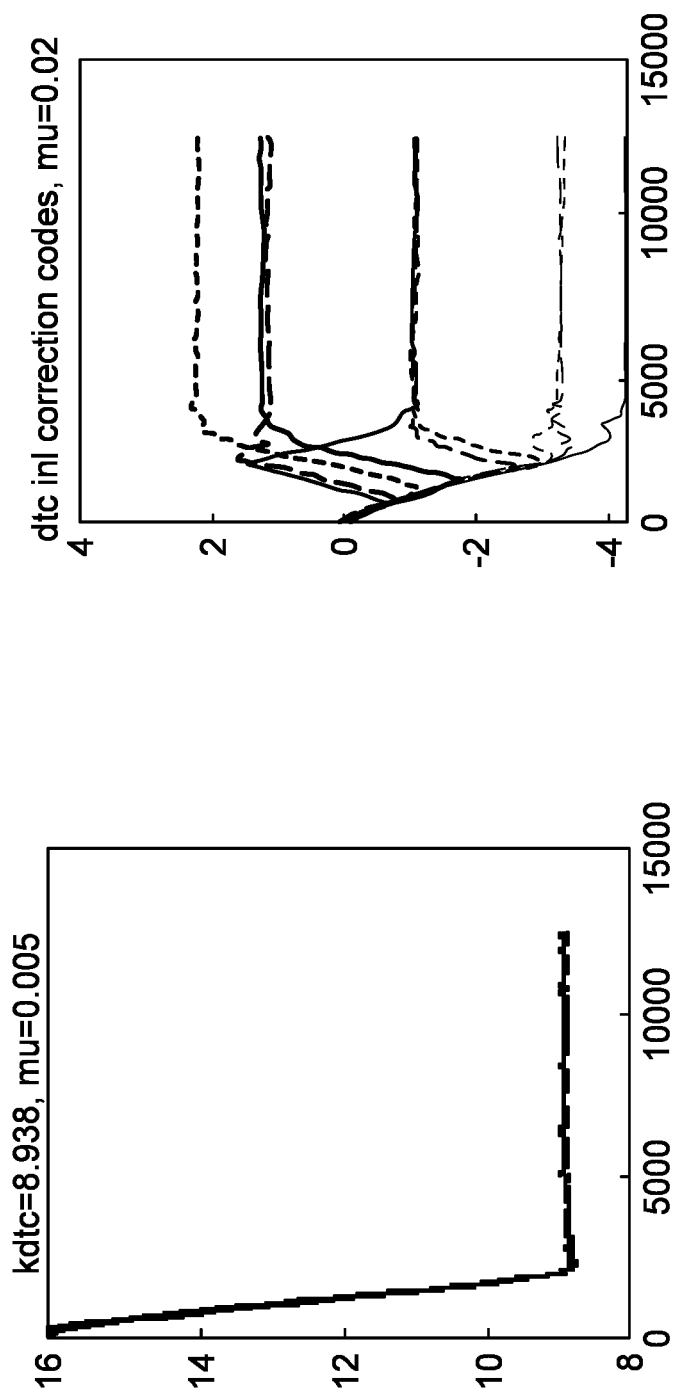
FIG. 7 illustrates Kdtc and DTC INL correction adaptation with constraints, according to an example.

Further, FIGS. 6 and 7 show the Kdtc and DTC INL correction adaptations without constraints (FIG. 6) and with constraints (FIG. 7), respectively. As can be observed, the loops converge with the constraints. Further, PLL level simulations show the DTC INL induced jitter can be effectively removed using the embodiments described herein.

To remove this interaction or extra adaptation degree of freedom, additional constraints can be added in the algorithm to provide a constrained DTC gain calibration loop and a constrained DTC integral INL correction loop where a search space is reduced by two degrees of freedom. In one embodiment, constraints can be added that reduce the search space when performing the vote in the dtc_inl_cor_vote module 405 in FIG. 4. One example is shown as:

dtc_inl_corr_vote(1)=0; % force code 0 as the inl reference dtc_inl_corr_vote(dtc_int_corr_forced_code+1)=0;   % force the specified code as the inl reference In this example, two correction codes are forced to 0 (e.g., a default value). A value of 0 may be preferred since forcing the correction for a first code to be 0 is a good reference for a typical analog circuit design. In addition, the correction for a second code can be forced to be 0. In one embodiment, this is the estimated maximum DTC code that is expected from the application. However, the second forced code does not have to be the maximum expected DTC code, but separating the two chosen codes by a wide margin can reduce estimation errors.

The result of the vote is then forwarded to a multiplier 410 which multiples the result of the vote with a dtc_inl_corr_mu, e.g., a step size used in the DTC INL correction loop 400. After accumulating the output of the multiplier 410 using an accumulator 415, the result is used to index into a dtc_inl_corr mapping table 420. In other words, for every dtc_code_int, a corresponding correction code is calculated by the INL correction loop and stored in the mapping table. For a given dtc_code_int, the corresponding dtc_inl_corr_code can be output by the mapping table 420 and then subsequently used to cancel the nonlinearity as shown in FIG. 2, That is, the output of the mapping table 420 is a DTC correction code (dtc_inl_correction_code) that can be combined with the tdc_out by the adder 205 in FIG. 2.

Figure 8:
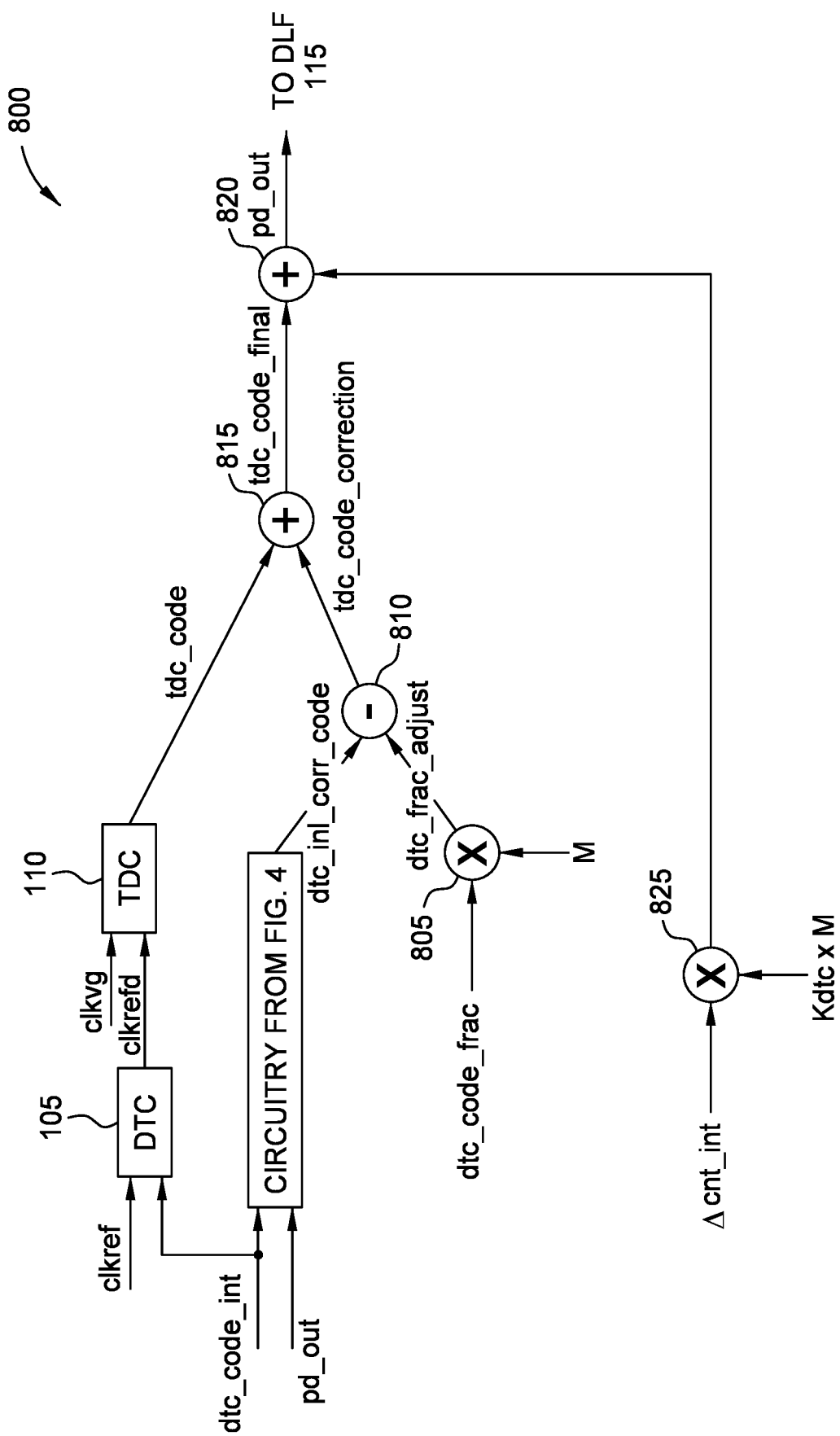
FIG. 8 is a circuit diagram of a DPLL where an output of a TDC is normalized to the resolution of the TDC, according to an example.

FIG. 8 is a circuit diagram of a DPLL 800 where an output of a TDC is normalized to the resolution of the TDC, according to an example. That is, FIG. 8 illustrates a DPLL 800 that receives the dtc_code_int and the dtc_code_frac from the predictive logic 125 illustrated in Fic 3. Also already discussed above, the dtc_code_int and pd_out is fed into the circuitry illustrated in FIG. 4.

The dtc_code_int is also provided to the DTC 105 which it then uses to delay the clkref to generate the delayed reference clock (clkrefd).

As discussed above, the predictive logic 125 in FIG. 3 generates a fractional portion of the digital code that is used to correct for the quantization error that occurs due to the generation of DTC code. That is, in one embodiment, the DTC 105 is controlled by an integer digital code—dtc_code_int—but this ignores that there also can exist a fraction portion which represents the quantization error of converting the FCW into an integer digital code dtc_code_int.

While the quantization error could be ignored, this makes the DPLL 800 less accurate. Instead, the fractional portion of the digital code—i.e., dtc_code_frac—is received at a multiplier 805 and scaled with M. Scaling the fractional portion dtc_code_frac with M, scales (or converts) this signal from the resolution of the DTC 105 to the resolution of the TDC 110. In one embodiment. M is a constant number. However, M can fluctuate due to process, voltage, and temperature (PVT) changes. In another embodiment, an adaption technique can be used to adjust M based on PVT changes. In any case, the output of the multiplier 805 is an adjusted fractional portion (dtc_frac_adjust).

Also mentioned above, the response of the DTC to the digital code dtc_code_int can be non-linear. Thus, in addition to providing dtc_code_int to the DTC 105, dtc_code_int is fed to the circuitry illustrated in FIG. 4 which corrects to the nonlinearity. In one embodiment, the INL represents the error between an ideal delay and the actual delay with the increasing delay codes. The delay units are cascaded and hence the non-ideal delay from each delay unit accumulates as the delay code increases. This is why INL is considered as opposed to DNL (Differential Nonlinearity), which is the difference between the ideal delay and the actual delay for each delay unit. For example, for a delay code (dtc_code_int) of 5, the accumulated or integrated nonlinearity of the first 5 delay units determines the nonlinearity correction that is applied to fix the INL.

The output of the circuitry in FIG. 4 (i.e., the dtc_inl_corr_code) is then subtracted from dtc_frac_adjust by a subtractor 810 to result in a correction value for correcting the tdc_code output by the TDC 110 which represents the time difference between the delayed reference clock clkrefd and a gate feedback clock clkvg received from the DCO.

In this embodiment, an adder 815 combines tdc_code_correction with tdc_code to generate tdc_code_final. This value is then combined by an adder 820 with the output of a multiplier 825.

The multiplier 825 receives a count integer (Δcnt_int) which is a count of the number of cycle differences between clkv and clkref and a gain of the DTC (i.e., kdtc) that is scaled by M which is an integer ratio between the resolution of the DTC 105 (dtc_res) and the resolution of the TDC 110 (tdc_res). That is, M can be expressed as:

$$M = \frac{dtc\_res}{tdc\_res} \quad (1)$$

Because Δcnt_int is based on the period of the clkv (Tclkv), but the DPLL 800 wants to normalize the tdc_code to the resolution of TDC—i.e., tdc_res—Δcnt_int is scaled by Tclkv/tdc_res. Using Equation 1, this can be expressed as:

$$\frac{Tclkv}{tdc\_res} = \frac{Tclkv}{dtc\_res} M \quad (2)$$

Given that the gain of the DTC 105 (kdtc) can be expressed as:

$$Kdtc = \frac{Tclkv}{dtc\_res} \quad (3)$$

Equation 2 can instead be expressed as:

$$\frac{Tclkv}{tdc\_res} = Kdtc \times M \quad (4)$$

Thus, the output of Equation 4 is the scaling factor that can be input into the multiplier 825 in order to scale Δcnt_int by Tclkv/tdc_res.

Also, in this embodiment, dtc_code_frac is scaled from dtc_res to tdc_res using the relationship in Equation 1. This scaling can be performed by providing the scaling factor of M to the multiplier 805 to generate dtc_frac_adjust.

The adder 820 generates the phase difference pd_out by combining the output of the multiplier 825 with the tdc_code_final. Pd_out can then be provided to the DLF 115 (not shown), In this manner, the tdc_code generated by the TDC 110 is normalized to the resolution of the TDC 110 and the nonlinearity of the dtc_code_int has been removed by the dtc_inl_corr_code.

Figure 9:
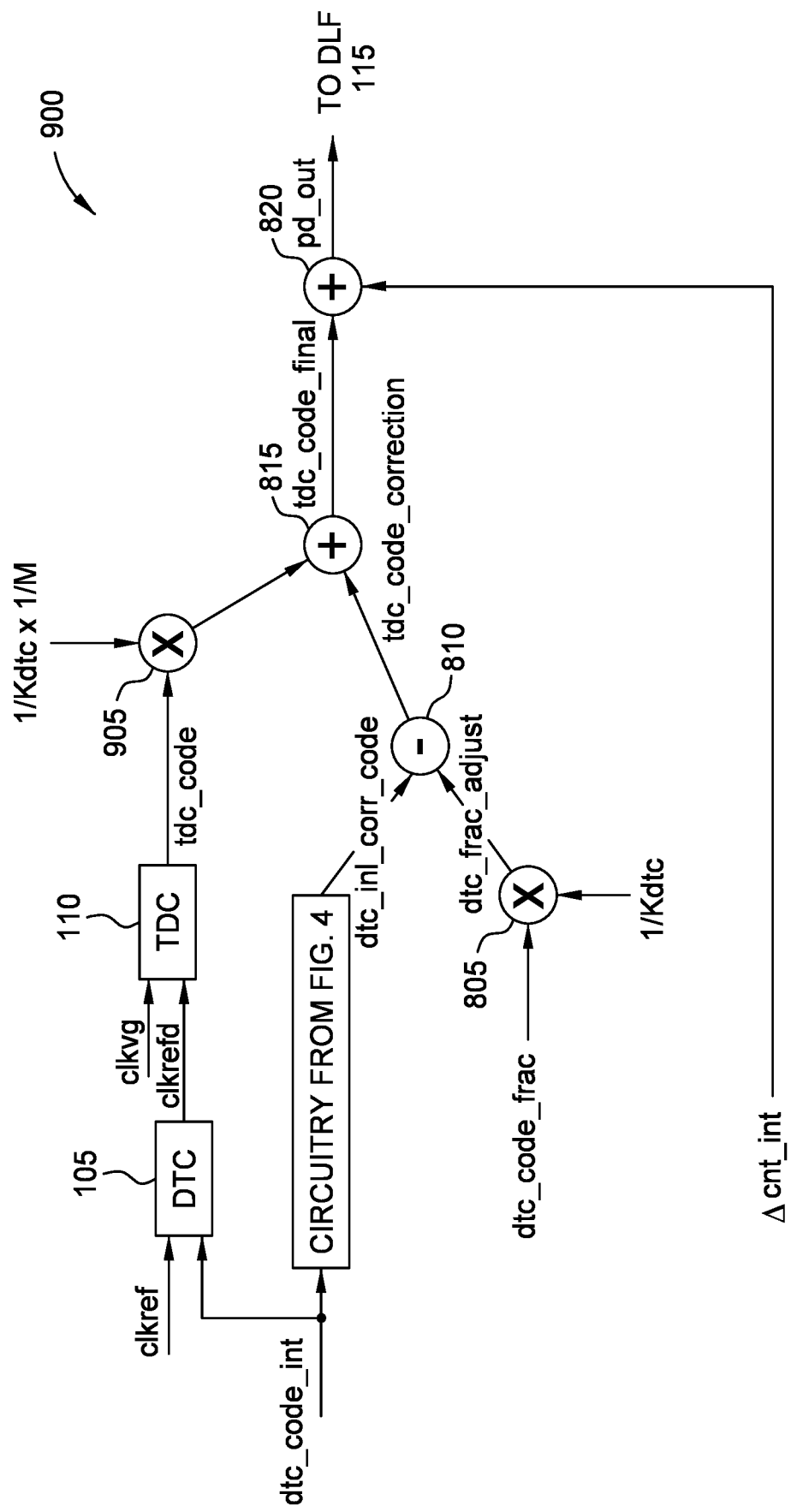
FIG. 9 is a circuit diagram of a DPLL where an output of a TDC is normalized to a period of the feedback clock, according to examples.

FIG. 9 is a circuit diagram of a DPLL 900 where an output of the TDC 110 is normalized to a period of the feedback clock, according to examples. That is, instead of normalizing the output to the resolution of the TDC 110 like in FIG. 8, the DPLL 900 normalizes the output to the period of the feedback dock Tclkv.

The same reference numbers are used in FIG. 9 as used in FIG. 8 to indicate circuitry that remains the same.

Relative to the circuitry of the DPLL 800 in FIG. 8, the DPLL 900 includes an additional multiplier 905 which multiplies the tdc_code to a scaling factor 1/Kdtc×1/M to normalize it to Tcklv. On the other hand, the DPLL 900 does not include the multiplier 825 in FIG. 8 since the count Δcnt_int is already based on Tclkv.

In addition to these circuit changes, the input of the multiplier 805 has changed in DPLL 900 relative to DPLL 800. Specifically, instead of receiving M, the multiplier 805 receives 1/Kdtc.

As shown in FIG. 9, the DPLL 900 relies on the multiplication factors of Kdtc, 1/Kdtc and (1/Kdtc×1/M). 1/Kdtc is equivalent to division of Kdtc. As such, the computation cost is high to perform these divisional operations. In contrast, FIG. 8 has no divisional operations. This can greatly reduce implementation costs as multiplication is less costly than division. Further, FIG. 8 also has fewer overall multiplication and division operations than FIG. 9.

Nonetheless, regardless of which normalization technique is used, FIGS. 8 and 9 illustrate that the outputs provided by FIG. 3 (e.g., the dtc_code_int and dtc_code_frac) and the circuitry in FIG. 4 can be used to generate a nonlinearity correction code, dtc_inl_corr_code, that compensates for the nonlinearity in the dtc_code_int.

Figure 10:
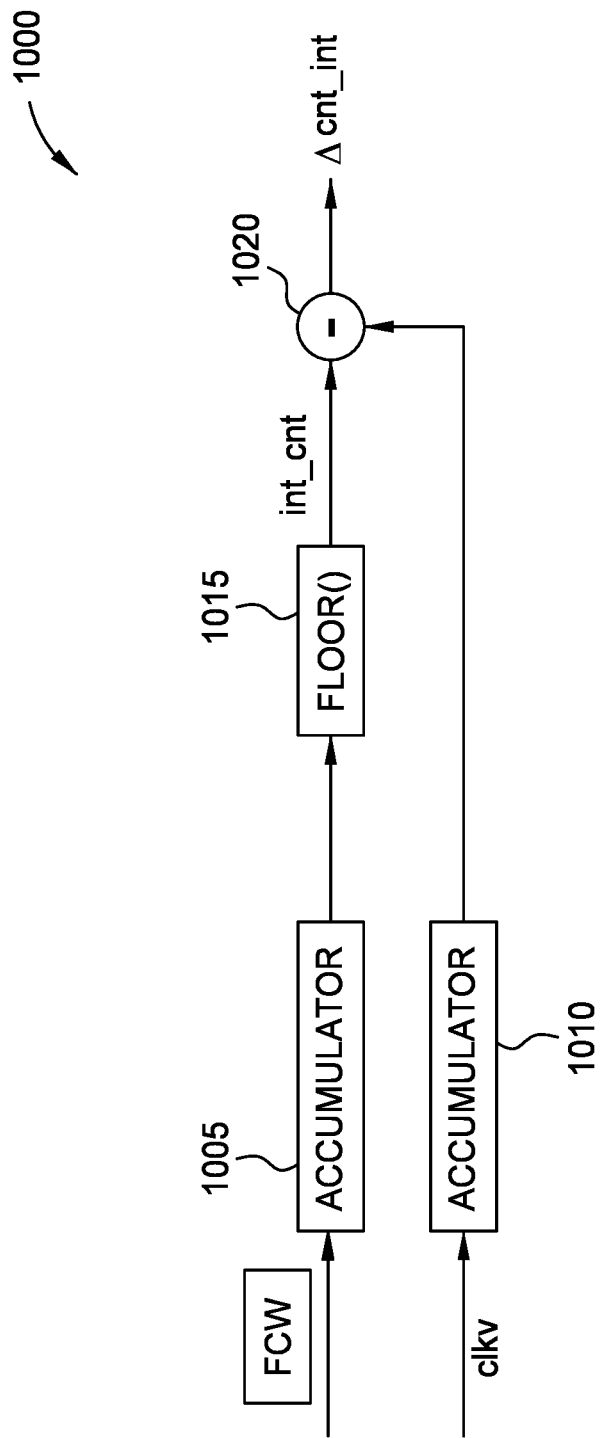
FIG. 10 is a circuit diagram for counting the cycle difference between the reference clock and feedback clock, according to examples.

FIG. 10 is a circuit 1000 for counting the cycle difference between the reference clock and feedback clock, according to examples. The circuit 1000 can be used in any of the DPLLs discussed above in FIGS. 8-9 to calculate the count Δcnt_int.

As shown, a first accumulator 1005 receives the FCW which is based on the ratio between clkref and clkv. FCW is fed to the accumulator 1005 in order to generate a measure of reference phase against which the DCO generated variable phase wilt be compared. One output of the accumulator 1005 is provided to a floor circuit 1015 which outputs an integer count (int_cnt) to a subtractor 1020. The quantized integer number output by the floor circuit 1015 represents the amount of phase that the whole number of DCO cycles should try to match.

In parallel, a second accumulator 1010 receives the feedback clock clkv. The output of the second accumulator 1010 is then subtracted from the int_cnt by a subtractor 1020 to generate Δcnt_int. Like the output of the floor circuit 1015, the output of the accumulator 1010 output is also an integer. The difference of the two integers represents the phase and frequency difference between clkv (actual) and the desired clock.

The circuitry discussed above in FIGS. 1-4 and 8-10 can be implemented on an integrated circuit. For example, the DPLL can be implemented in an integrated circuit (e.g., an application specific integrated circuit (ASIC)).

Figure 11:
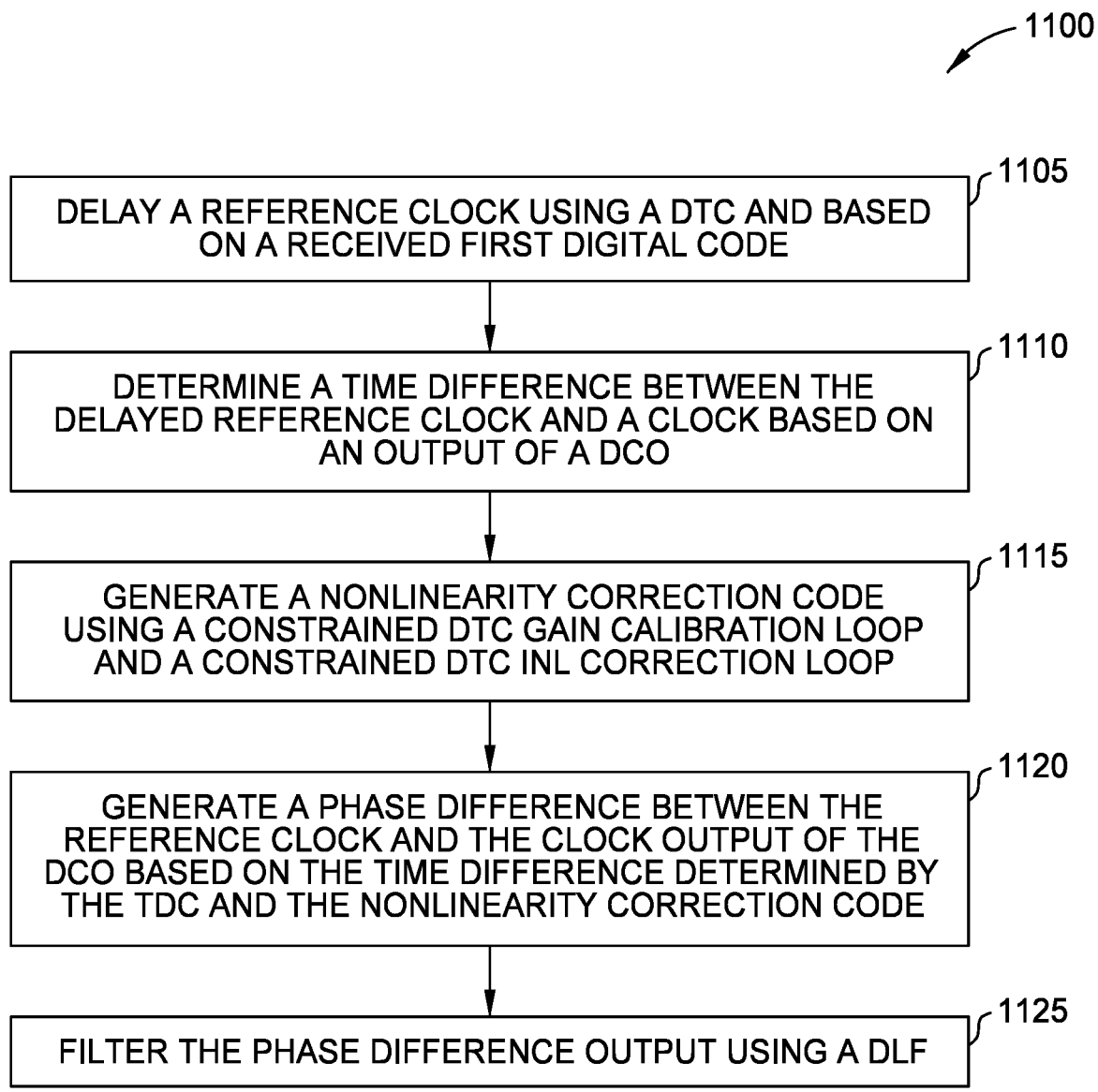
FIG. 11 is a flowchart for correcting nonlinearity in a DTC, according to an example.

FIG. 11 is a flowchart of a method 1100 for correcting nonlinearity in a DTC, according to an example. The method 1100 includes, at block 1105, delaying a reference clock using a DTC and based on a received first digital code. This is illustrated in FIG. 2 where the DTC 105 delays the reference clock clkref using the dtc_code_int.

At block 1110, a TDC determines a time difference between the delayed reference clock and a clock based on an output of a DCO. Again referring to FIG. 2, the TDC 110 determines a digital code tdc_out which indicates the time (or phase) difference between the delayed reference clock clkref and the clock clkv generated by the DCO 120.

At block 1115, a constrained DTC gain calibration loop and a constrained DTC INL correction loop generate a nonlinearity correction code. One example of a DTC gain calibration loop 370 is illustrated in FIG. 3 and one example of a DTC INL correction loop 400 is illustrated in FIG. 4. These loops can operate in parallel (or simultaneously) and can be constrained using any of the techniques discussed above. The output of the DTC INL correction loop is the nonlinearity correction code dtc_inl_corr_code.

At block 1120, a combination circuit generates a phase difference between the reference dock and the dock output of the DCO based on the second digital code that represents the time difference determined by TDC and the nonlinearity correction code. As illustrated in FIG. 2, the adder 205 combines the digital code tdc_out with the nonlinearity correction code dtc_inl_corr_code to output the phase difference pd_out.

FIGS. 8 and 9 also illustrate adjusting tdc_out based on the dtc_inl_corr_code but also using the dtc_frac_adjust from the fractional portion of the digital code. In that case, tdc_code is combined with tdc_code_correction which is in turn based on both dtc_inl_corr_code and dtc_frac_adjust.

At block 1125, a DLF filters the phase difference pd_out.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A digital phase locked loop (DPLL), comprising:
    a digital-to-time converter (DTC) configured to receive a reference clock and delay the reference clock based on a received first digital code;
    a time-to-digital converter (TDC) configured to output a second digital code indicating a time difference between the delayed reference clock output by the DTC and a clock generated by a digital controlled oscillator (DCO);
    circuitry comprising a constrained DTC gain calibration loop and a DTC integral nonlinearity (INL) correction loop configured to generate a nonlinearity correction code;
    a combination circuit configured to combine the second digital code with the nonlinearity correction code; and
    a digital loop filter configured to receive an output of the combination circuit.

2. The DPLL of claim 1, wherein the DTC gain calibration loop and the DTC INL correction loop are constrained by reducing a corresponding search space by two degrees of freedom.

3. The DPLL of claim 2, wherein two correction codes in the search space are forced to a default value.

4. The DPLL of claim 3, wherein one of the correction codes that are forced to the default value is associated with an estimated maximum DTC code for a corresponding application.

5. The DPLL of claim 2, where the DTC gain calibration loop is configured to use the two degrees of freedom to determine a gain of the DTC, and the DTC INL correction loop is configured to determine vertical offsets based on a line having a slope defined by the gain of the DTC.

6. The DPLL of claim 1, wherein the DTC gain calibration loop comprises a first voting module configured to vote between a phase difference between the reference clock and the clock generated by the DCO.

7. The DPLL of claim 6, wherein the first voting module is coupled to a multiplier that multiples an output of the first voting module with a step size.

8. The DPLL of claim 6, wherein the DTC INL correction loop includes a second voting module configured to vote between the first digital code and the phase difference between the reference clock and the clock generated by the DCO.

9. The DPLL of claim 8, wherein the DTC INL correction loop further comprises a mapping table configured to, for a given digital code, output the nonlinearity correction code.

10. An integrated circuit, comprising:
    a DTC configured to receive a reference clock and delay the reference clock based on a received first digital code;
    a TDC configured to output a second digital code indicating a time difference between the delayed reference clock output by the DTC and a clock generated by a DCO;
    a constrained DTC gain calibration loop and a constrained DTC INL correction loop configured to generate a nonlinearity correction code;
    circuitry configured to generate a phase difference between the reference clock and the clock generated by the DCO based on the second digital code and the nonlinearity correction code; and
    a digital loop filter configured to receive the phase difference.

11. The integrated circuit of claim 10, wherein the DTC gain calibration loop and the DTC INL correction loop are constrained by reducing a corresponding search space by two degrees of freedom.

12. The integrated circuit of claim 11, wherein two correction codes in the search space are forced to a default value.

13. The integrated circuit of claim 12, wherein one of the correction codes that are forced to the default value is associated with an estimated maximum DTC code for a corresponding application.

14. The integrated circuit of claim 11, where the DTC gain calibration loop is configured to use the two degrees of freedom to determine a gain of the DTC, and the DTC INL correction loop is configured to determine vertical offsets based on a line having a slope defined by the gain of the DTC.

15. The integrated circuit of claim 10, wherein the DTC gain calibration loop comprises a first voting module configured to vote between the phase difference between the reference clock and the clock generated by the DCO.

16. The integrated circuit of claim 15, wherein the first voting module is coupled to a multiplier that multiples an output of the first voting module with a step size.

17. The integrated circuit of claim 15, wherein the DTC INL correction loop includes a second voting module configured to vote between the first digital code and the phase difference between the reference clock and the clock generated by the DCO.

18. The integrated circuit of claim 17, wherein the DTC INL correction loop further comprises a mapping table configured to, for a given digital code, output the nonlinearity correction code.

19. A method of operating a DPLL, the method comprising:
- delaying a reference clock using a DTC and based on a received first digital code;
- determining, using a TDC, a time difference between the delayed reference clock and a clock output by a DCO;
- generating a nonlinearity correction code using a constrained DTC gain calibration loop and a constrained DTC INL correction loop;
- generating, based on the time difference determined by the TDC and the nonlinearity correction code, a phase difference between the reference clock and the clock output by the DCO; and
- filtering the phase difference using a DLF.

20. The method of claim 19, wherein the DTC gain calibration loop and the DTC INL correction loop are constrained by reducing a corresponding search space by two degrees of freedom.

\* \* \* \* \*